United States Patent
Tomita

(10) Patent No.: US 8,593,179 B2
(45) Date of Patent: Nov. 26, 2013

(54) DELAY CIRCUIT AND INVERTER FOR SEMICONDUCTOR INTEGRATED DEVICE

(75) Inventor: Takashi Tomita, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/241,304

(22) Filed: Sep. 23, 2011

(65) Prior Publication Data

US 2012/0081151 A1   Apr. 5, 2012

(30) Foreign Application Priority Data

Oct. 4, 2010 (JP) ................................. 2010-224891

(51) Int. Cl.
    *H03K 19/20* (2006.01)
(52) U.S. Cl.
    USPC ............................................. 326/121
(58) Field of Classification Search
    USPC .................... 326/121, 82–87, 106, 108, 112; 361/91.5
    See application file for complete search history.

(56) References Cited

U.S. PATENT DOCUMENTS

| 4,888,498 | A  | * | 12/1989 | Kadakia ..................... 327/546 |
| 4,908,528 | A  | * | 3/1990  | Huang ........................ 326/24  |
| 5,614,815 | A  | * | 3/1997  | Yamagata et al. ........... 323/313   |
| 6,448,830 | B1 | * | 9/2002  | Chuang et al. ............... 327/205 |
| 2002/0036942 | A1 | * | 3/2002  | Ooishi ....................... 365/226 |
| 2009/0195306 | A1 | * | 8/2009  | Chen et al. .................. 330/9   |

FOREIGN PATENT DOCUMENTS

JP   63-226110 A   9/1988

* cited by examiner

*Primary Examiner* — Thienvu Tran
(74) *Attorney, Agent, or Firm* — Rabin & Berdo, P.C.

(57) ABSTRACT

An inverter of a delay circuit in a semiconductor integrated device that has a high resistance to an electrostatic discharge. The delay circuit includes at least one inverter. Each inverter has high and low potential parts. The low potential part includes a pair of FETs. A source terminal of one FET is connected to a drain terminal of the other FET at a first common node. The high potential part includes another pair of FETs, with a source terminal of one FET being connected to a drain terminal of the other FET at a second common node. A power supply potential is applied to the first common node when the inverter output becomes a high potential. A ground potential is applied to the second common node when the inverter output becomes a low potential.

14 Claims, 4 Drawing Sheets

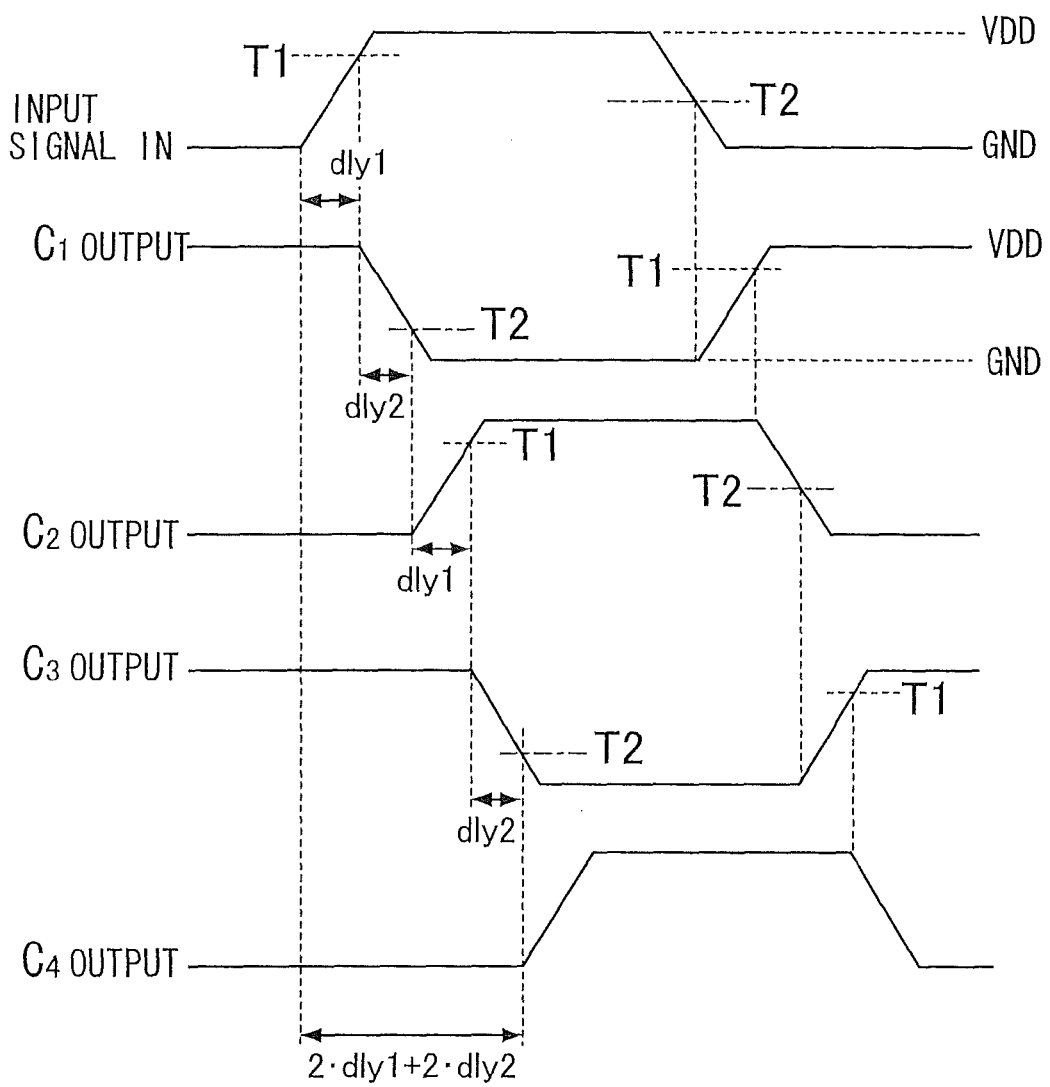

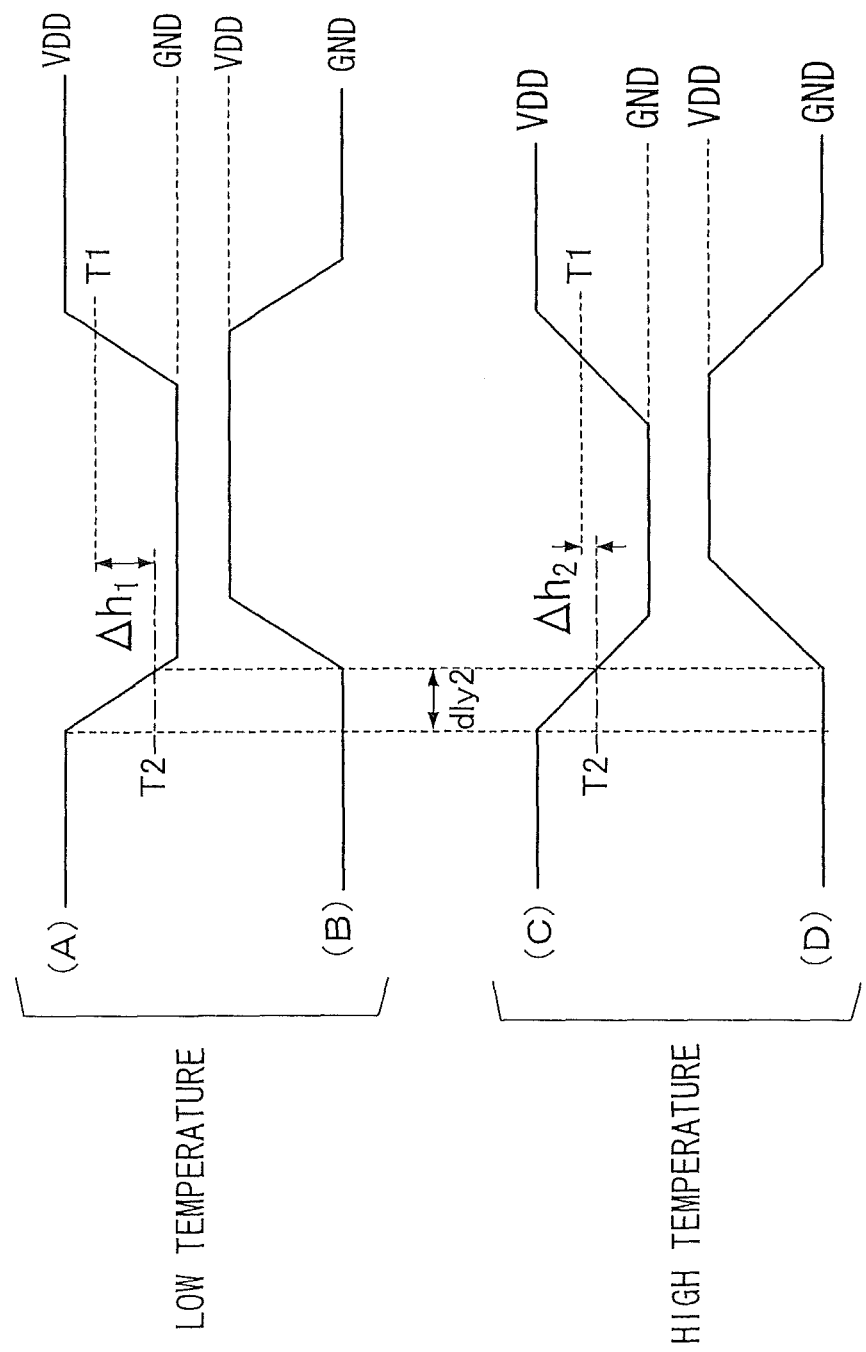

DELAY CIRCUIT AND INVERTER FOR SEMICONDUCTOR INTEGRATED DEVICE

BACKGROUND OF THE INVENTION

The present invention relates to a delay circuit of a semiconductor integrated device, and an inverter that is provided in the delay circuit.

SUMMARY OF THE INVENTION

In order to implement a delay circuit in a semiconductor integrated device, there has been known a design technique of connecting inverter elements in series until a desired delay time is obtained. Such a delay circuit, however, has a problem that a large error relative to the desired delay time can occur due to manufacturing variations, variations in power supply potential, and changes in ambient temperature.

A hysteresis inverter circuit configured to suppress variations in delay time due to temperature changes has therefore been proposed (for example, see Japanese Patent Application Publication (Kokai) No. 63-226110). The hysteresis inverter circuit uses a thermal sensing circuit. The thermal sensing circuit includes a field effect transistor (FET) and a resistance connected in series (see items P4 and R1, and items N4 and R2 in FIG. 1 of Japanese Patent Application Kokai No. 63-226110) to apply potentials corresponding to the ambient temperature to the inverter elements. The thresholds of the inverter elements are thereby modified to follow the ambient temperature. This makes it possible to always obtain a desired (constant) delay time regardless of changes in ambient temperature.

The thermal sensing circuit utilizes a particular characteristic of the FET, i.e., the ON resistance varies with temperature. To use the FETs (P4 and N4) as resistances, a ground potential or a power supply potential is directly applied to the gate terminals of the FETs. However, this creates a problem, i.e., the gates of the FETs (P4 and N4) may be broken in the event of an electrostatic discharge.

The thermal sensing circuit is a voltage division circuit that has an FET and a resistor connected in series in order to generate a desired potential. As a result, a direct current always flows through the thermal sensing circuit and consumes a considerable amount of electricity.

An object of the present invention is to provide a delay circuit for a semiconductor integrated device that has a high resistance to an electrostatic discharge and can suppress variations in delay time with low power consumption.

Another object of the present invention is to provide an inverter for a semiconductor integrated device that has a high resistance to an electrostatic discharge and can suppress variations in delay time with low power consumption.

According to one aspect of the present invention, there is provided a delay circuit for a semiconductor integrated device. The delay circuit includes a plurality of inverters connected in cascade. Each inverter includes a pair of first FETs and a pair of second FETs. Each of the first FETs has a channel of a first conductivity type. A drain of one of the first FETs and a source of the other are connected to each other at a first connection node. Gates of both the first FETs are connected to each other at an input node. A first potential is applied to a source of the one of the first FETs, and a drain of the other is connected to an output node. Each of the second FETs has a channel of a second conductivity type. A drain of one of the second FETs and a source of the other are connected to each other at a second connection node. Gates of both the second FETs are connected to each other at the input node. A second potential is applied to a source of the one of the second FETs, and a drain of the other is connected to the output node. Each inverter also includes a first additional FET that applies the second potential to the first connection node when a potential at the output node becomes the second potential. Each inverter also includes a second additional FET that supplies the second potential to the first additional FET. Each inverter also includes a third additional FET. The first potential is applied to a source of the third additional FET, and a drain of the third additional FET is connected to a gate of the second additional FET. Each inverter also includes a fourth additional FET. The second potential is applied to a source of the fourth additional FET. Gate and drain of the fourth additional FET are connected to a gate of the third additional FET. Each inverter also includes a fifth additional FET that applies the first potential to the second connection node when a potential at the output node becomes the first potential. Each inverter also includes a sixth additional FET that supplies the first potential to the fifth additional FET. Each inverter also includes a seventh additional FET. The second potential is applied to a source of the seventh additional FET. A drain of the seventh additional FET is connected to a gate of the sixth additional FET. Each inverter also includes an eighth additional FET. The first potential is applied to a source of the eighth additional FET. Gate and drain of the eighth additional FET are connected to a gate of the seventh additional FET.

According to another aspect of the present invention, there is provided an inverter for a semiconductor integrated device. The inverter is designed to generate a signal having an inverted level of an input signal. The inverter includes a pair of first FETs and a pair of second FETs. Each first FET has a channel of a first conductivity type. A drain of one of the first FETs is connected to a source of the other first FET at a first connection node. Gates of the two first FETs are connected to each other at an input node. A first potential is applied to a source of the above-mentioned "one of the first FETs," and a drain of the other is connected to an output node. Each second FET has a channel of a second conductivity type. A drain of one of the second FETs is connected to a source of the other second FET at a second connection node. Gates of the two second FETs are connected to each other at the input node. A second potential is applied to a source of the above-mentioned "one of the second FETs," and a drain of the other is connected to the output node. The inverter also includes a first additional FET that applies the second potential to the first connection node when a potential at the output node becomes the second potential. The inverter also includes a second additional FET that supplies the second potential to the first additional FET. The inverter also includes a third additional FET. The first potential is applied to a source of the third additional FET, and a drain of the third additional FET is connected to a gate of the second additional FET. The inverter also includes a fourth additional FET. The second potential is applied to a source of the fourth additional FET. Gate and drain of the fourth additional FET are both connected to a gate of the third additional FET. The inverter also includes a fifth additional FET that applies the first potential to the second connection node when a potential at the output node becomes the first potential, and a sixth additional FET that supplies the first potential to the fifth additional FET. The inverter also includes a seventh additional FET. The second potential is applied to a source of the seventh additional FET, and a drain of the seventh additional FET is connected to a gate of the sixth additional FET. The inverter also includes an eighth additional FET. The first potential is applied to a source of the eighth additional FET. Gate and drain of the eighth additional FET are both connected to a gate of the seventh additional FET.

According to the present invention, a power supply potential is applied to a low potential part of the inverter when the inverter produces an output signal with a high potential, and a ground potential is applied to a high potential part of the inverter when the inverter produces an output signal with a low potential. Such potential application provides the inverter with a hysteresis characteristic. To suppress, reduce or eliminate variations in delay time, there are also provided transistors that function as suppliers of the power supply potential and the ground potential. Such transistors are maintained ON not by applying the power supply potential and the ground potential directly to the gate terminals of the transistors, but by applying the power supply potential and the ground potential through respective two-stage transistors. Therefore, the transistors that function as the suppliers of the power supply potential and the ground potential are not broken or damaged even if an electrostatic discharge takes place. Moreover, the hysteresis characteristic of the inverter is provided by the application of the power supply potential and the ground potential to the low potential part and the high potential part, respectively, without allowing a direct current to pass through the circuit. This results in a reduction in power consumption if compared with a configuration that allows a direct current to pass through the circuit.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 3 is a timing chart showing the delay operation of the delay circuit shown in FIG. 1; and FIG. 4 is a timing chart showing the delay characteristic of one inverter at different ambient temperatures (high temperature, low temperature).

DETAILED DESCRIPTION OF THE INVENTION

An exemplary delay circuit of a semiconductor integrated device according to the present invention includes an inverter that has a high potential part and a low potential part. The low potential part includes a pair of FETs (MN21 and MN22). A source terminal of one FET is coupled to a drain terminal of the other FET at a first common node (CL1). The high potential part includes another pair of FETs (MP21 and MP22), with a source terminal of one FET being coupled to a drain terminal of the other FET at a second common node (CL2). A power supply potential is applied to the first common node when the inverter output becomes a high potential. A ground potential is applied to the second common node when the inverter output becomes a low potential. Such potential application provides a hysteresis characteristic for the inverter operation. To suppress or eliminate variations in delay time due to manufacturing variations or changes in ambient temperature, there are also provided additional FETs (MP41 and MN41) that function as suppliers of the power supply potential and the ground potential. The supplier FETs (MP41 and MN41) are kept in an on condition by applying the ground potential and the power supply potential to the gate terminals of the FETs (MP41 and MN41) through two double-stage of FETs (MP12 and MN42, and MN12 and MP42), respectively.

Figure 1:
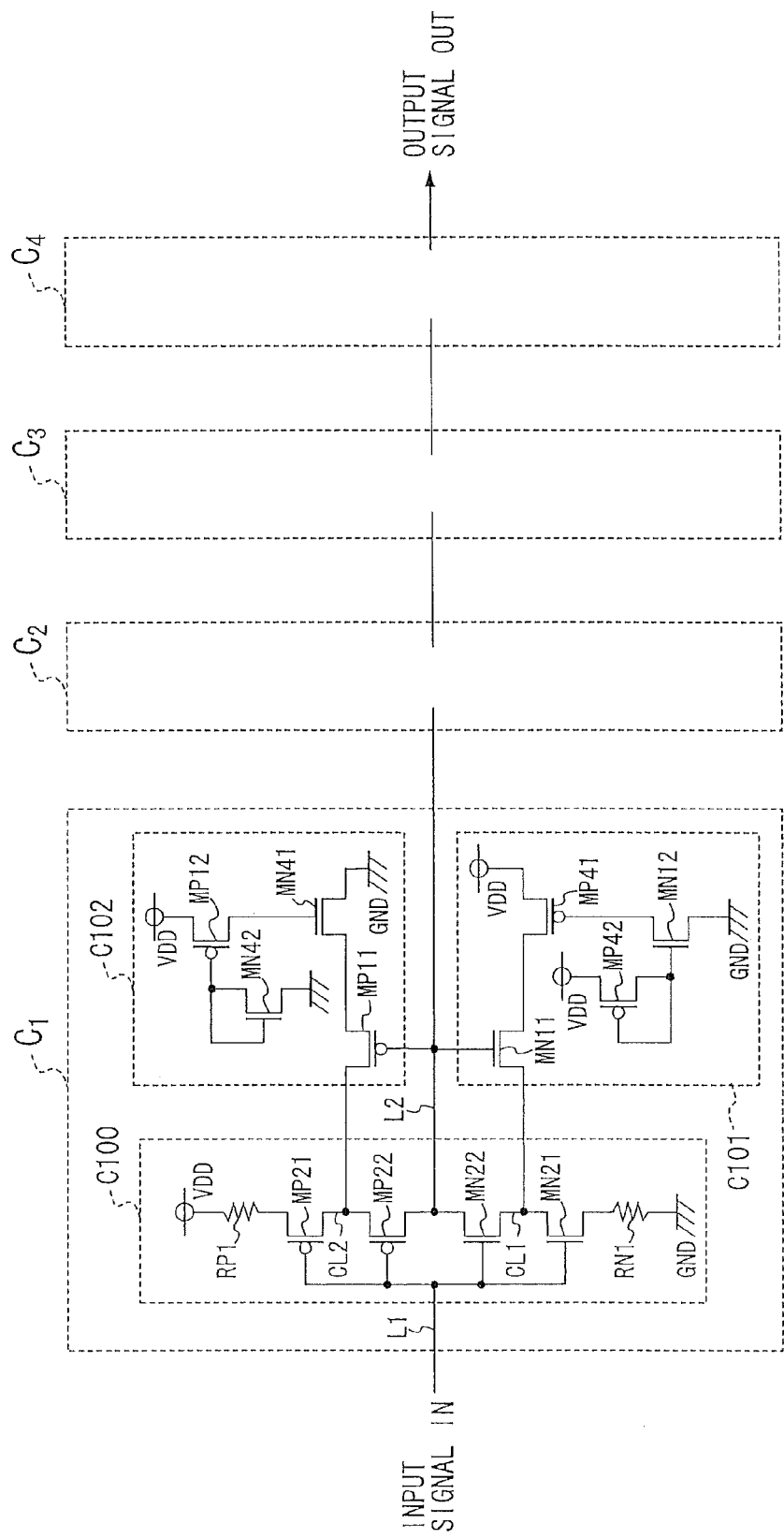
FIG. 1 is a circuit diagram showing the configuration of a delay circuit according to one embodiment of the present invention.

Referring to FIG. 1, the configuration of the delay circuit of the semiconductor integrated device according to one embodiment of the present invention will be described in detail.

As shown in FIG. 1, the delay circuit includes a plurality of inverters $C_1$ to $C_4$ connected in series. Each inverter $C_1$, $C_2$, $C_3$, $C_4$ has a hysteresis characteristic.

The inverters $C_1$ to $C_4$ have the same configuration. Each inverter includes a hysteresis inverter circuit C100 (hereinafter, referred to as an HS inverter circuit C100), a power supply potential application circuit C101, and a ground potential application circuit C102.

The HS inverter circuit C100 has four transistors MP21, MP22, MN21 and MN22. The transistors MP21 and MP22 are p-channel metal-oxide semiconductor (MOS) field effect transistors (FETs) which constitute a high potential generation unit of the inverter. The transistors MN21 and MN22 are n-channel MOSFETs which constitute a low potential generation unit of the inverter. The gate terminals of the respective transistors MP21, MP22, MN21 and MN22 are connected to an input line L1. A power supply potential VDD is applied to the source terminal of the transistor MP21 through a resistor RP1. The drain terminal of the transistor MP21 is connected to the source terminal of the transistor MP22. A ground potential GND is applied to the source terminal of the transistor MN21 through another resistor RN1. The drain terminal of the transistor MN21 is connected to the source terminal of the transistor MN22. The drain terminals of the transistors MP22 and MN22 are connected to an output line L2.

In the HS inverter circuit C100 of such a configuration, if a signal supplied through the input line L1 has a high potential level corresponding to the power supply potential VDD, the transistors MN21 and MN22 among the four transistors MP21, MP22, MN21 and MN22 are turned on to apply the ground potential GND to the output line L2. If the signal supplied through the input line L1 has a low potential level corresponding to the ground potential GND, the transistors MP21 and MP22 among the transistors MP21, MP22, MN21 and MN22 are turned on to apply the power supply potential VDD to the output line L2. In other words, when a signal having a high potential (VDD), i.e., a signal corresponding to a logic level 1 is supplied through the input line L1, the HS inverter circuit C100 generates the inverted logic level 0, i.e., the inverted signal having a low potential (GND) to the output line L2. On the other hand, when a signal having the low potential (GND), i.e., a signal corresponding to the logic level 0 is supplied, the HS inverter circuit C100 issues the inverted logic level 1, i.e., the inverted signal having the high potential (VDD) to the output line L2.

The power supply potential application circuit C101 has four transistors MP41, MP42, MN11 and MN12. The transistors MP41 and MP42 are p-channel MOSFETs, and the transistors MN11 and MN12 are n-channel MOSFETs. The power supply potential VDD is applied to the source terminal of the transistor MP42. Both the gate terminal and the drain terminal of the transistor MP42 are connected to the gate terminal of the transistor MN12. The ground potential GND is applied to the source terminal of the transistor MN12. The drain terminal of the transistor MN21 is connected to the gate terminal of the transistor MP41. The power supply potential VDD is applied to the source terminal of the transistor MP41.

The drain terminal of the transistor MP41 is connected to the drain terminal of the transistor MN11. Such a configuration maintains the transistors MP41, MP42 and MN12 always in an on condition. As a result, the power supply potential VDD is always applied to the drain terminal of the transistor MN11 through the transistor MP41. The gate terminal of the transistor MN11 is connected to the output line L2. The source terminal of the transistor MN11 is connected to a connection node CL1 which connects the drain terminal of the transistor MN21 and the source terminal of the transistor MN22 in the HS inverter circuit C100.

In the power supply potential application circuit C101 having the above-described configuration, the transistor MN11 is turned on only when the HS inverter circuit C100 generates the signal of the high potential (VDD) to the output line L2. Consequently, the power supply potential application circuit C101 applies the power supply potential VDD to the connection node CL1 between the transistors MN21 and MN22 of the HS inverter circuit C100 through the transistors MP41 and MN11.

The ground potential application circuit C102 has four transistors MP11, MP12, MN41 and MN42. The transistors MP11 and MP12 are p-channel MOSFETs, and the transistors MN41 and MN42 are n-channel MOSFETs. The ground potential GND is applied to the source terminal of the transistor MN42. Both the gate terminal and the drain terminal of the transistor MN42 are connected to the gate terminal of the transistor MP12. The power supply potential VDD is applied to the source terminal of the transistor MP12. The drain terminal of the transistor MP12 is connected to the gate terminal of the transistor MN41. The ground potential GND is applied to the source terminal of the transistor MN41. The drain terminal of the transistor MN41 is connected to the drain terminal of the transistor MP11. Such a configuration maintains the transistors MN41, MN42 and MP12 always in an on condition. As a result, the ground potential GND is always applied to the drain terminal of the transistor MP11 through the transistor MN41. The gate terminal of the transistor MP11 is connected to the output line L2. The source terminal of the transistor MP11 is connected to a connection node CL2 which connects the drain terminal of the transistor MP21 and the source terminal of the transistor MP22 in the HS inverter circuit C100.

In the ground potential application circuit C102 having the above-described configuration, the transistor MP11 is turned on only when the HS inverter circuit C100 generates the signal of the low potential (GND) to the output line L2. Consequently, the ground potential application circuit C102 applies the ground potential GND to the connection node CL2 between the transistors MP21 and MP22 of the HS inverter circuit C100 through the transistors MN41 and MP11.

The operation of the inverter C including the above-described HS inverter circuit C100, the power supply potential application circuit C101 and the ground potential application circuit C102 will be described below.

Figure 2:
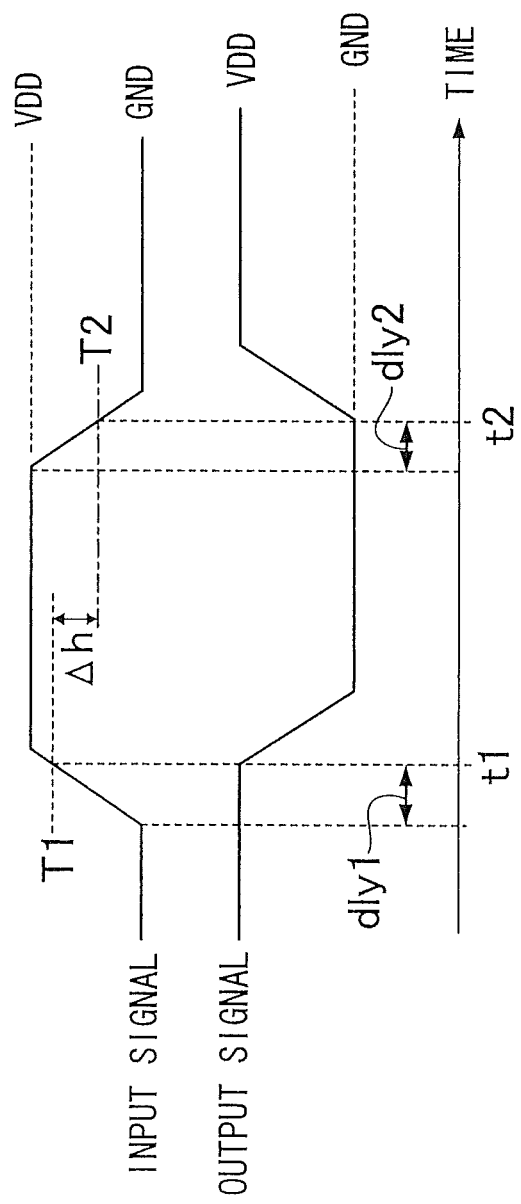
FIG. 2 is a timing chart showing a delay characteristic of one of a plurality of inverters included in the delay circuit of FIG. 1.

As shown in FIG. 2, during the rise-up period of the input signal, the level of the output signal of the inverter C starts dropping at time t1 when the input signal level reaches a first threshold T1. During the fall-down period of the input signal, the level of the output signal of the inverter C starts rising at time t2 when the level of the input signal reaches a second threshold T2.

More specifically, immediately before the rising of the input signal, the HS inverter circuit C100 is generating the signal of the high potential (VDD) to the output line L2. This keeps the transistor MN11 of the power supply potential application circuit C101 in an on condition. During this on-condition period the power supply potential VDD is applied to the connection node CL1 between the transistors MN21 and MN22 of the HS inverter circuit C100 through the transistor MN11. The transistor MN21 subsequently is turned on when the voltage applied to the gate terminal of the transistor MN21 exceeds the threshold of the transistor MN21 itself in the rise-up period of the input signal. As a result, the ON resistances of the transistors MP41, MN11 and MN21 together with the resistor RN1 constitute a voltage division circuit. The voltage division circuit generates a high potential based on the power supply potential VDD, and the generated high potential is applied to the source terminal of the transistor MN22. This increases the apparent threshold of the transistor MN22 by a back-gate bias effect. Thus, the threshold of the inverter is increased. In consequence, the HS inverter circuit C100 determines that a high potential corresponding to the logic level 1 is applied, and decreases the level of the output signal for inversion when the signal level of the input signal exceeds the first threshold T1 in the rise-up period of the input signal.

Immediately before the falling of the input signal, the HS inverter circuit C100 is generating the signal of the low potential (GND) to the output line L2. This keeps the transistor MP11 of the ground potential application circuit C102 in an on condition. During this on-condition period the ground potential GND is applied to the connection node CL2 between the transistors MP21 and MP22 of the HS inverter circuit C100 through the transistor MP11. The transistor MP21 subsequently is turned on when the voltage applied to the gate terminal of the transistor MP21 reaches the threshold of the transistor MP21 itself in the fall-down period of the input signal. As a result, the ON resistances of the transistors MN41, MP11 and MP21 together with the resistor RP1 form a voltage division circuit. The voltage division circuit generates a low potential based on the ground potential GND, and the generated low potential is applied to the source terminal of the transistor MP22. This lowers the apparent threshold of the transistor MP22 by a back-gate bias effect, and accordingly the threshold of the inverter is lowered. In consequence, the HS inverter circuit C100 determines that a low potential corresponding to the logic level 0 is applied, and increases the level of the output signal for inversion when the signal level of the input signal falls below the second threshold T2 in the fall-down period of the input signal.

In other words, during the rise-up period of the input signal from the ground potential GND level (logic level 0), the inverter C starts decreasing the level of the output signal, which has been maintained in the level of the power supply potential VDD (logic level 1), down to the level of the ground potential GND (logic level 0) at the time t1 when the level of the input signal reaches the first threshold T1. On the other hand, as shown in FIG. 2, in the fall-down period of the input signal from the power supply potential VDD level (logic level 1), the inverter C starts increasing the level of the output signal up to the power supply potential VDD level (logical level 1) at the time t2 when the level of the input signal reaches the second threshold T2 (T1>T2).

In the rise-up period of the input signal, the inverter C therefore decreases the level of the output signal for level inversion with a delay dly1 as shown in FIG. 2. On the other hand, in the fall-down period of the input signal, the inverter C increases the level of the output signal for level inversion with a delay dly2 as shown in FIG. 2.

The difference between the first threshold T1 and the second threshold T2 shown in FIG. 2 is a hysteresis width $\Delta h$. The greater the hysteresis width $\Delta h$, the longer the delay times dly1 and dly2. The hysteresis width Δh increases as the drain currents of the transistors MN11 and MP41 of the power supply potential application circuit C101 and those of the transistors MP11 and MN41 of the ground potential application circuit C102 increase. The drain currents of the respective transistors MN11, MP41, MN41 and MP11 can thus be used to set the delay times dly1 and dly2 of the inverter C to desired delay times. It is also possible to set desired delay times dly1 and dly2 by adjusting the resistances of the resistors RP1 and RN1 in the HS inverter circuit C100. More specifically, the resistances of the resistors RP1 and RN1 may be increased to make gentler the level transition of the output signal over time, i.e., make the delay times dly1 and dly2 longer. On the other hand, the resistances of the resistors RP1 and RN1 may be decreased to make steeper the level transition of the output signal over time, i.e., make the delay times dly1 and dly2 shorter. As compared to the setting of the delay times dly1 and dly2 by using the drain currents of the transistors, the setting of the delay times dly1 and dly2 by using the resistors RP1 and RN1 is less susceptible to manufacturing variations and can thus set desired delay times dly1 and dly2 with higher precision.

The delay circuit shown in FIG. 1 includes the four inverters $C_1$ to $C_4$ connected in series, and each inverter possesses the delay times dly1 and dly2. As shown in FIG. 3, the delay circuit thereby delays the input signal IN by the delay time of 2·dly1+2·dly2 for output. It should be noted that the number of stages of inverters C to be connected in series is not limited to four. Two, three, five or more inverters C may be connected in series. Alternatively, a single inverter C may be used alone. In short, the delay time varies in proportion to the number of inverters C, and inverters C may be connected in series as many as a desired delay time is obtained.

Semiconductor integrated devices of MOS structures vary in operating speed depending on the ambient temperature.

For example, an input signal having a waveform indicated by the curve (A) in FIG. 4 is supplied to the inverter C when the ambient temperature is low. An input signal having a waveform indicated by the curve (C) in FIG. 4 is supplied to the inverter C when the ambient temperature is high. That is, as indicated by the curves (A) and (C) in FIG. 4, the level transitions in the rising and falling periods of the input signal are gentler at high ambient temperature than at low ambient temperature.

At low ambient temperature, the transistors MP41 and MN11 have lower ON resistances, which in turn increase the potential of the source terminal of the transistor MN22. On the other hand, at high ambient temperature, the transistors MP41 and MN11 have higher ON resistances, which in turn decrease the potential of the source terminal of the transistor MN22. Consequently, when the ambient temperature is high as shown by the curve (C) in FIG. 4, the first threshold T1 of the inverter C in the rising part of the input signal is lower than when the ambient temperature is low as shown by the curve (A) in FIG. 4.

Similarly, at low ambient temperature, the transistors MN41 and MP11 have lower ON resistances, which in turn decrease the potential of the source terminal of the transistor MP22. At high ambient temperature, the transistors MN41 and MP11 have higher ON resistances, which in turn increase the potential of the source terminal of the transistor MP22. Consequently, when the ambient temperature is high as shown by the curve (C) in FIG. 4, the second threshold T2 of the inverter C in the falling period of the input signal is higher than when the ambient temperature is low as shown by the curve A. In short, as shown by the curves (A) and (C) in FIG. 4, the hysteresis width Δh2 at high ambient temperature is smaller than the hysteresis width Δh1 at low ambient temperature.

At high ambient temperature, the level transitions in the rising and falling periods of the input signal are gentler and the delay time is longer than at low ambient temperature. The increase in delay time, however, is suppressed since the hysteresis width Δh decreases with the increasing ambient temperature. This allows the suppression of a difference between the delay time dly2 of the output signal at low temperature shown by the curve (B) in FIG. 4, obtained based on the input signal shown by the curve (A) in FIG. 4, and the delay time dly2 of the output signal at high temperature shown by the curve (D) in FIG. 4, obtained based on the input signal shown by the curve (C) in FIG. 4.

As described above, the inverter C utilizes the changes in the ON resistances of the transistors MP41, MN11, MN41 and MP11 with ambient temperature to self-adjust the delay time to a constant value regardless of changes in ambient temperature.

The inverter C shown in FIG. 1 can suppress changes in delay time even if the drain currents of the transistors vary with manufacturing variations or variations in the power supply potential VDD. More specifically, when the drain currents of the transistors are lower than predetermined values, the level transitions in the rising and falling periods of the output signal become gentler and the delay time becomes longer as in the case of high ambient temperature shown in by the curves (C) and (D) in FIG. 4. In the meantime, the hysteresis width Δh decreases with the increasing drain currents of the transistors, and such a decrease functions to suppress the increase in delay time. As a result, the inverter C can suppress changes in delay time in spite of variations in the drain currents of the transistors.

The transistor MP41 in the power supply potential application circuit C101 of the inverter C functions as the supplier of the power supply potential VDD. The transistor MP41 is kept in the on condition not by applying the ground potential GND directly to the gate terminal of the transistor MP41, but by applying the ground potential GND to the gate terminal of the transistor MP41 through the transistors MP42 and MN12 as shown in FIG. 1. The transistor MN41 in the ground potential application circuit C102 functions as the supplier of the ground potential GND. The transistor MN41 is kept in the on condition not by applying the power supply potential VDD directly to the gate terminal of the transistor MN41, but by applying the power supply potential VDD to the gate terminal of the transistor MN41 through the transistors MN42 and MP12 as shown in FIG. 1.

It is therefore possible to avoid electrostatic breakdown of the transistors MP41 and MN41 through the respective gate terminals even if an electrostatic discharge occurs.

The power supply potential application circuit C101 and the ground potential application circuit C102 shown in FIG. 1 include no element that constantly passes a direct current with high current consumption. This allows a reduction in power consumption.

This application is based on Japanese Patent Application No. 2010-224891 filed on Oct. 4, 2010, and the entire disclosure thereof is incorporated herein by reference.

What is claimed is:

1. A delay circuit of a semiconductor integrated device comprising:
 a plurality of inverters connected in cascade, each said inverter including:
  a pair of first FETs that each have a channel of a first conductivity type, a drain of one of the first FETs and a source of the other being connected to each other at a first connection node, gates of both the first FETs being connected to each other at an input node, a first potential being always applied to a source of the one of the first FETs as long as the semiconductor integrated device is in operation, and a drain of the other being connected to an output node;

a pair of second FETs that each have a channel of a second conductivity type, a drain of one of the second FETs and a source of the other being connected to each other at a second connection node, gates of both the second FETs being connected to each other at the input node, a second potential being always applied to a source of the one of the second FETs as long as the semiconductor integrated device is in operation, and a drain of the other being connected to the output node;

a first additional FET that applies the second potential to the first connection node when a potential at the output node becomes the second potential;

a second additional FET that always supplies the second potential to the first additional FET as long as the semiconductor integrated device is in operation;

a third additional FET whose source receives the first potential and whose drain is connected to a gate of the second additional FET;

a fourth additional FET whose source receives the second potential and whose gate and drain are both connected to a gate of the third additional FET;

a fifth additional FET that applies the first potential to the second connection node when a potential at the output node becomes the first potential;

a sixth additional FET that always supplies the first potential to the fifth additional FET as long as the semiconductor integrated device is in operation;

a seventh additional FET whose source receives the second potential and whose drain is connected to a gate of the sixth additional FET; and an eighth additional FET whose source receives the first potential and whose gate and drain are both connected to a gate of the seventh additional FET.

2. The delay circuit of a semiconductor integrated device according to claim 1, wherein the first potential is applied to the source of the one of the first FETs through a first resistor, and the second potential is applied to the source of the one of the second FETs through a second resistor.

3. The delay circuit of a semiconductor integrated device according to claim 2, wherein the first resistor has a variable resistance, and the second resistor has a variable resistance.

4. The delay circuit of a semiconductor integrated device according to claim 1, wherein the first additional FET, the third additional FET, the sixth additional FET and the eighth additional FET each have a channel of the first conductivity type, and the second additional FET, the fourth additional FET, the fifth additional FET and the seventh additional FET each have a channel of the second conductivity type.

5. The delay circuit of a semiconductor integrated device according to claim 1, wherein each said first FET is an n-channel MOSFET, and each said second FET is a p-channel MOSFET.

6. The delay circuit of a semiconductor integrated device according to claim 1, wherein how many said inverters are included in the delay circuit is determined by a desired delay time provided by the delay circuit.

7. The delay circuit of a semiconductor integrated device according to claim 1, wherein the first potential is a power source potential and the second potential is a ground potential.

8. An inverter of a semiconductor integrated device for generating a signal having an inverted level of an input signal, the inverter comprising:

a pair of first FETs that each have a channel of a first conductivity type, a drain of one of the first FETs and a source of the other being connected to each other at a first connection node, gates of both the first FETs being connected to each other at an input node, a first potential being always applied to a source of the one of the first FETs as long as the semiconductor integrated device is in operation, and a drain of the other being connected to an output node;

a pair of second FETs that each have a channel of a second conductivity type, a drain of one of the second FETs and a source of the other being connected to each other at a second connection node, gates of both the second FETs being connected to each other at the input node, a second potential being always applied to a source of the one of the second FETs as long as the semiconductor integrated device is in operation, a drain of the other being connected to the output node;

a first additional FET that applies the second potential to the first connection node when a potential at the output node becomes the second potential;

a second additional FET that always supplies the second potential to the first additional FET as long as the semiconductor integrated device is in operation;

a third additional FET whose source receives the first potential and whose drain is connected to a gate of the second additional FET;

a fourth additional FET whose source receives the second potential and whose gate and drain are both connected to a gate of the third additional FET;

a fifth additional FET that applies the first potential to the second connection node when a potential at the output node becomes the first potential;

a sixth additional FET that always supplies the first potential to the fifth additional FET as long as the semiconductor integrated device is in operation;

a seventh additional FET whose source receives the second potential and whose drain is connected to a gate of the sixth additional FET; and an eighth additional FET whose source receives the first potential and whose gate and drain are both connected to a gate of the seventh additional FET.

9. The inverter of a semiconductor integrated device according to claim 8, wherein the first potential is applied to the source of the one of the first FETs through a first resistor, and the second potential is applied to the source of the one of the second FETs through a second resistor.

10. The inverter according to claim 9, wherein the first resistor has a variable resistance, and the second resistor has a variable resistance.

11. The inverter of a semiconductor integrated device according to claim 8, wherein the first additional FET, the third additional FET, the sixth additional FET and the eighth additional FET each have a channel of the first conductivity type, and the second additional FET, the fourth additional FET, the fifth additional FET and the seventh additional FET each have a channel of the second conductivity type.

12. The inverter according to claim 8, wherein each said first FET is an n-channel MOSFET, and each said second FET is a p-channel MOSFET.

13. The inverter according to claim 8, wherein the first potential is a power source potential and the second potential is a ground potential.

14. A delay circuit of a semiconductor integrated device comprising an inverter of claim 8.

* * * * *